United States Patent
Böck et al.

[11] Patent Number: 6,077,094
[45] Date of Patent: Jun. 20, 2000

[54] PLUG CONNECTOR MEANS WITH GRIPPER RIB

[75] Inventors: Jürgen Böck, Markgröningen; Peter Rühle, Weinstadt/Schnait; Jochen Franz, Reutlingen; Walter Suchy, Stuttgart, all of Germany

[73] Assignee: Festo AG & Co., Esslingen, Germany

[21] Appl. No.: 09/195,417

[22] Filed: Nov. 18, 1998

[30] Foreign Application Priority Data

Dec. 2, 1997 [DE] Germany .................... 297 21 298 U

[51] Int. Cl.[7] .................................................. H01R 12/00
[52] U.S. Cl. .................................................. 439/82; 439/83
[58] Field of Search .............................. 439/55, 81, 82, 439/860

[56] References Cited

U.S. PATENT DOCUMENTS

| | | | |
|---|---|---|---|
| 3,022,480 | 2/1962 | Tiffany | 439/45 |
| 3,670,409 | 6/1972 | Reimer | 29/853 |
| 4,950,173 | 8/1990 | Minemura et al. | 439/82 |
| 5,173,055 | 12/1992 | Grabbe | 439/66 |
| 5,791,946 | 8/1998 | Mendez | 439/860 |
| 5,812,378 | 9/1998 | Fjelstad et al. | 361/769 |

FOREIGN PATENT DOCUMENTS 195 12 221 A1  9/1996  Germany ............... H01R 9/09

*Primary Examiner*—Renee Luebke
*Assistant Examiner*—Michael C. Zarroli
*Attorney, Agent, or Firm*—Hoffmann & Baron LLP

[57] ABSTRACT

A plug connector having a main body, which has at least one connecting unit including an opening delimited at the side of an elongated transversely elastic gripping rib. The opening constitutes a plug socket, into which a plug element may be inserted and acted upon by the gripping rib. The gripping rib has a concave shaped longitudinal edge portion facing away from the plug socket such that the width of the gripper rib increases toward the two ends of the rib.

14 Claims, 1 Drawing Sheet

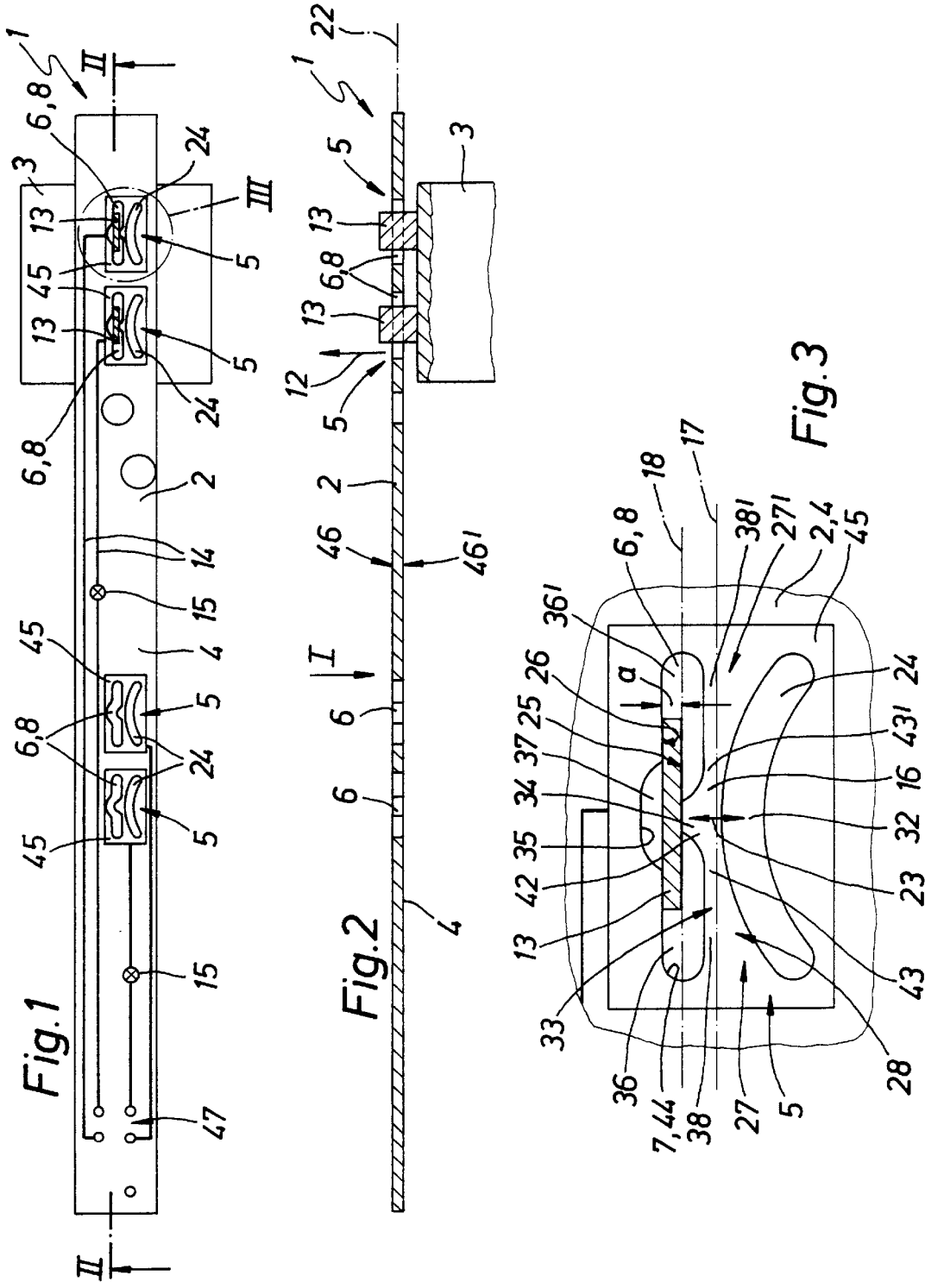

PLUG CONNECTOR MEANS WITH GRIPPER RIB

BACKGROUND OF THE INVENTION

The invention relates to a plug connector means comprising a main body having at least one connecting unit, which possesses an opening delimited laterally by an elongated, transversely elastic gripper rib, such opening forming a plug socket, into which a plug element, which is for example pin- or lug-like, can be so inserted that it is acted upon by the gripper rib.

THE PRIOR ART

The German patent publication 3,610,978 C2 discloses a plug connector means designed for use in conjunction with printed circuit boards to render possible an electrically conducting contact connection between wires of the printed circuit board and the plug elements of an electromagnet associated with a valve. The printed circuit board possesses a number of openings, corresponding to the number of plug elements, to serve as plug receiving sockets, into which the plug elements may be inserted. One advantage of this design lies in the fact that it makes it unnecessary to fit the printed circuit board with suitable plug sockets. However there is some complexity within the plug receiving socket, as for instance as regards the introduction of a for example electrically conducting elastomeric composition in order to produce the desired gripping force causing the electrical contact between the plug socket and the associated plug element.

In conjunction with a plug connector means of the type initially mentioned, known to the assignee, there has already been a suggestion to design the one limit on the longitudinal side of the plug sockets in the form of an elongated and transversely elastic gripping rib. The insertion width as defined between the gripping rib and the longitudinal edge opposite to same is designed to be somewhat less than the width of the plug element to be inserted so that on insertion of the plug element the gripping rib is deflected resiliently elastically and its restoring force acts on the plug element as a gripping force to ensure a reliable electrical contact.

However it has turned out to be a disadvantage with known plug connector means that the gripping rib extending between the plug socket and a further opening is inclined to be overstretched due to the cumulative effects of inaccuracy in a pair of parts or owing to rough handling of such a plug connector means, such overstretching leading to permanent plastic distortion and a reduction in the gripping force. This will mean that there is no longer any reliable mechanical connection between the parts plugged together. In cases in which the plug connector means is employed for producing an electrically conducting connection there may in addition to this be problems with making electrical contact.

SUMMARY OF THE INVENTION

One object of the invention is to create a plug connector means of the type initially mentioned, which ensures a permanently reliable mechanical, and—in case of need—an electrically conducting connection between interfitting components.

In order to achieve these and/or other objects appearing from the present specification, claims and drawings, in the present invention the gripping rib is widened out at its two ends. This is achieved by having the gripping rib's longitudinal edge portion facing away from the plug socket designed with an at least essentially arcuate form corresponding to a concavity of the gripping rib.

While in the prior art the gripping rib is joined to the adjacent regions of the main body via terminal portions with a constant cross section, in the design of the invention there is a gradual widening of the gripping rib toward the points of connection, something which is attained to a significant extent by the concave and essentially arcuate configuration of the edge portion facing away from the plug socket of the gripping rib. The result is an increase in the cross section of the gripping rib toward both ends and, as a result, a higher load carrying capacity in the elastically resilient portion. Furthermore, even in the case of an inaccurately manufactured plug element and plug socket that may give give a cumulative overall inaccuracy a sufficiently high gripping force is ensured between the plug socket and the plug element which in turn leads to a reliable mechanical gripping connection between the plug socket and the plug element. Simultaneously a reliable electrical contact can be ensured in the event of the plug connector device being also employed for the production of an electrically conducting plug connector. All in all the plug connector means of the invention furthermore ensures the maintenance of a high gripping force over long periods of time.

Further advantageous developments of the invention are defined in the claims.

In order to be sure of a surface pressing action, produced by the gripping force, between the two parts of which one is inserted in the other, the longitudinal edge portion facing the plug socket of the gripping rib may particularly in the middle possess a raised part extending into the plug socket, the length of the edge portion as measured in the longitudinal direction of the plug socket being smaller than the dimension, measured in the same direction, of the inserted plug element. This feature furthermore renders possible the provision of comparatively narrow widths of gripping within a plug socket which has a larger width and thus renders simpler manufacture possible. For instance, it is possible for the plug socket to be machined out of the main body with a milling tool.

The plug socket can be so placed on a main body that the gripping rib constitutes an outer edge section of the main body. In the case of another preferred design rendering possible placement at any desired point within the base area of the main body, the plug socket is provided adjacent to a further opening, which defines a deformation-free space for the gripping rib, the gripping rib extending as a dividing or partition element between the two openings. On insertion of a plug element into the plug socket, something which may for example be performed as well by slipping the main body over a corresponding plug element, the gripping rib is slightly deformed toward the further opening, such further opening providing sufficient space for deformation.

In accordance with a preferred development of the invention the further opening adjacent to the plug socket takes the form of an arcuate slot more particularly having a constant width along its length. Such a configuration may for example be produced extremely simply by a milling operation.

Although the configuration of the main body is in principle able to be freely selected, a tabular or plate-like configuration has turned out to be particularly advantageous. If the plug connector means is to be employed to produce an electrically conducting connection, it is possible for the main body to be more especially in the form of a printed circuit board bearing one or more electrical conductors arranged and designed in any convenient way. The electrical conductors are more particularly, but not necessarily, in the form of printed wiring. Furthermore other electrical and/or electronic components may be provided on the main body.

Further advantageous developments and convenient forms of the invention will be understood from the following detailed descriptive disclosure of one embodiment thereof in conjunction with the accompanying drawings.

LIST OF THE SEVERAL VIEWS OF THE FIGURES

FIG. 1 shows a first design of the plug connector means of the invention in conjunction with a connection between a printed circuit board and an electromagnet employed for the operation of a valve in a plan view looking toward an area of the printed circuit board in the direction of the arrow I in FIG. 2.

FIG. 2 is a longitudinal section taken on the section line II—II through the arrangement of FIG. 1.

FIG. 3 shows the section or part III as marked in FIG. 1 on a larger scale.

DETAILED ACCOUNT OF WORKING EMBODIMENT OF THE INVENTION

FIG. 1 shows a plug connector means generally referenced 1, which is provided in connection with a printed circuit board 2. It renders possible the production of a mechanical and simultaneously electrically conducting connection between the printed circuit board 2 and an electrical component 3, which in the working example is constituted by a electromagnet for a valve which is not illustrated in more detail.

The plug connector means 1 comprises a preferably tabular main body 4 representing the printed circuit board 2 in the present case, such main body having at least one connecting unit 5 on it. As a rule the main body 4 will possess several such connecting units 5, the working example being provided with four connecting units 5. One of the connecting units 5 is illustrated in FIG. 3 on a larger scale.

Each connecting unit 5 possesses a first elongated opening 6, which extends through the main body 4 at a right angle to the plane of its board and has a slot-like shape, it being delimited by an encircling area 7.

The first opening 6 constitutes a plug socket 8, which serves to receive a plug element 13 inserted into it athwart the board plane as indicated by arrow 12. The operation of plugging in is generally performed so that the respective plug element 13 extends through the plug socket 8 and a part of its length is within the plug socket 8.

The plug element 13 is provided on the electrical component 3 and extends like a projection from this electrical component 3. The plug element 13 may for example be like a pin or, as in the present working example, like a lug or tongue. Dependent on the design of the electrical component 3 one or more plug elements 13 can be provided thereon at the same time, the purpose being to electrically connect such plug elements with the printed circuit board 2. The electrical component 3 of the working example possesses two plug elements 13, which, when the plug connection is produced, fit into the plug sockets 8 of two connecting units 5.

In the working example the plug connector provides both a mechanical, and also an electrically conducting connection between the printed circuit board 2 and the electrical component 3. It is in this manner that electrical conductors extending in the electrical component 3 and/or component (not illustrated) may be connected electrically with electrical conductors 14 and/or electrical or electronic components 13 on the printed circuit board 2.

However given a suitable design of the plug connector means it is also possible to ensure a purely mechanical connection as well in order to for example to mechanically lock together any desired main body and any desired component by plugging same together mechanically.

One of the two longitudinal limits of the elongated plug socket 8 is constituted by an elongated, transversely elastic gripping rib 16. Its longitudinal axis 17 extends in parallelism to the longitudinal axis 18 of the plug socket 8. It may be deformed elastically reversibly athwart its longitudinal axis 17 in the plane of extension 22, which in the present case coincides with the plane of the board, of the main body 4, such elastic deformation being indicated by the double arrow 23.

The gripping rib 16 is constituted in the present embodiment of the invention by having a further, second opening 24 formed in the main body 4 to the side of the first opening plug socket 8.

The two openings 6 and 24 are arranged so as to be adjacent at their longitudinal sides and define the gripping rib 16 between them. In other words the two openings 6 and 24 are separated from each other by the gripping rib 16.

If a plug element 13 is plugged into the plug socket 8, it is acted upon by actuating faces 25 and 26, which are constituted by the regions of the limiting face sections adjoining the plug socket 8 at the longitudinal side. The clearance distance "a" marked in FIG. 3 between the mutually opposite actuating faces 25 and 26 is so selected in relation to the correspondingly measured thickness of the plug element 13 to be inserted that the clearance distance "a" prior to insertion is somewhat smaller than the thickness of the plug element 13. If now a plug element 13 is inserted into the plug socket 8 in the insertion direction 12, there will be a slight widening of the plug socket 8 in the transverse direction, the gripping rib 16 being elastically deformed resiliently toward the second opening 24. Owing to the transverse elasticity of the gripping rib 16 and the tendency thereof to return into the initial position, the gripping rib 16 will exert a gripping force on the associated side face of the plug element 13 and thrust same against the oppositely arranged second actuating faces 26. It is in this manner that the plug element 13 is frictionally and firmly held in the plug socket 8.

In order to ensure that the gripping force exerted by the gripping rib does not become less in the course of time and to ensure a high gripping force without the danger of a permanent plastic deformation of the gripping rib 16, the gripping rib 16 is made wider at its two ends 27 and 27' extending in the longitudinal direction 17. There is more particularly a gradual, continuous widening out starting from the middle portions of the gripping rib 16. Such widening is produced preferably by a design such that the edge portion 28 (facing away from the plug socket 8 and facing toward the second opening) of the gripping rib 16 (in the following referred to as the outer edge portion 28) possesses an at least essentially arcuate shape as a concavity of the gripping rib 16. Owing to the arcuate shape the gripping rib accordingly has a concave shape on the side facing the second opening 24. Thus the gripping rib 16 is stiffened at its end portion subjected to the maximum load so that fatigue of its material is prevented and higher gripping forces are ensured. In order to produce the curved outer edge part 28 in the simplest possible manner, in the working example the second opening 24 is formed like a circularly arcuate slot, whose two end portions are generally at the same level as the end portions of the plug socket 8 and whose apical portion 32 is generally at the same level as the longitudinal middle of the plug socket 8. The outwardly curved part is turned toward the plug socket.

The width, as measured in the plane 22 of extent, of the second opening 24 has minimum size which ensures the necessary transverse mobility of the gripping rib 16 and accordingly a sufficient allowance for deformation for the same. For example it is possible for the second opening 24 to be produced by machining as part of a milling operation. The same applies moreover for the plug socket 8 as well.

However it may prove difficult to mill the plug socket 8 with such a width that a comparatively thin plug element 13 may be securely held in place. The plug socket 8 in the working example consequently has a shape such that despite a comparatively large width it is possible to have available a small, desired clearance distance "a" as a gripping distance. Thus on the longitudinal edge portion 33, facing the plug socket 8, of the gripping rib 16 (in the following referred to as the inner edge portion 33) a raised portion 34 projecting into the plug socket 8, is provided approximately at the length center such raised portion having the first actuating face 25 thereon. Facing such face 25 there is, on the opposite longitudinal side of the plug socket 8, a recess 35, whose longitudinal extent is larger than that of the raised portion 34, the regions, which adjoin the recess 35 axially on either side, each forming a second actuating face 26. The clearance distance "a" between the first actuating face 25 and the second actuating faces 26 on the opposite side, defines the gripping distance for the locking in place of the inserted plug element 13.

All in all there is accordingly a configuration for the plug socket 8 with two linear end portions 36 and 36', which are connected together by a U-like middle arc section 37. This slotted form may be produced for example in a milling operation so that the plug socket has an at least approximately constant width along its entire length.

The inner edge portion 33 facing the plug socket 8, of the gripping rib 16 has, owing to the above mentioned configuration of the plug socket 8, two terminal linear end sections 38 and 38' and a hump-like middle section 42 defined by the raised portion 34. Functionally adjacent to this middle section 42 the gripper rib 16 is made wider, a portion with a minimum width 43 adjoining the middle section 42 and starting at such minimum width portion the width of the gripping rib 16 increases toward the ends 27 and 27' in accordance with the curvature of the outer edge portion 28 continuously.

Since the plug connector means 1 of the working example is also to effect the making of electrical contact in addition to providing a mechanical anchoring function, the delimiting area 7 encircling the plug socket is at least partially constituted by an electrically conducting contact face. In the interests of providing for simple manufacture in the working example the entire delimiting area 7 is designed as contact face 44. For this purpose the main body 4 may be provided with an electrically conductive conducting layer of, for instance copper, which is applied after making the two openings 6 and 24 so that through contacting of the plug socket 8 is also possible. It is convenient for the delimiting areas of the second opening 24 to be provided with a corresponding conductive layer as well, it being possible to have such a design that at the two mutually opposite board faces 46 and 46' there is a coated zone functionally adjacent to the connecting units 5.

In the illustrated working example the conductive layer 45 associated with the respective plug socket 8 is connected with at least one electrical conductor 14, more particularly in the form of printed wiring, provided at or on the main body 4. If required diagrammatically indicated electrical and/or electronic components 15 can be placed on the conductors 14. In the working example the conductors 14 extend to a terminal point 47, at which an electrical contact with another component may be made.

What is claimed is:

1. A plug connector means comprising:

a main body having at least one connecting unit, which possesses an opening delimited laterally by an elongated, transversely elastic gripper rib having two ends, such opening forming a plug socket into which a plug element can be inserted such that the plug element is acted upon by the gripper rib, the gripper rib having a concave shaped longitudinal edge portion facing away from the plug socket such that the width of the gripper rib increases toward the two ends thereof.

2. The plug connector means as set forth in claim 1, wherein the opening constituting the plug socket possesses a slot-like and essentially elongated form and is delimited longitudinally by the gripping rib.

3. The plug connector means as set forth in claim 1, wherein the longitudinal edge portion facing the plug socket, of the gripping rib extends, at least at its two end sections, essentially in parallelism with the longitudinal axis of the plug socket.

4. The plug connector means as set forth in claim 1, wherein the longitudinal edge portion, facing the plug socket, of the gripping rib has a raised portion extending into the plug socket approximately at its longitudinal middle.

5. The plug connector means as set forth in claim 4, wherein the raised portion is opposite to a recess provided on the opposite longitudinal side of the plug socket.

6. The plug connector means as set forth in claim 1, wherein the plug socket has an at least approximately constant width after its entire length.

7. The plug connector means as set forth in claim 1, wherein the connecting unit possesses a further opening adjacent to the plug socket, which is divided off from the plug socket by the gripping rib and provides a deformation-free space for the gripping rib.

8. The plug connector means as set forth in claim 1, wherein the further opening has the form of an circularly arcuate slot.

9. The plug connector means as set forth in claim 1, wherein the main body possesses a plurality of connecting units.

10. The plug connector means as set forth in claim 1, wherein the main body possesses is tabular in shape and has the openings present extending through it perpendicularly to the plane of the board.

11. The plug connector means as set forth in claim 10, wherein the main body is constituted by a printed circuit board.

12. The plug connector means as set forth in claim 1, wherein the area delimiting the plug socket, of the main body is at least partially formed by an electrically conducting contact face, which is connected with at least one electrical conductor provided on the main body and for making electrical contact is provided with a plugged in electrically conducting plug element.

13. The plug connector means as set forth in claim 12, wherein the contact face is constituted by a conductive layer applied to the main body.

14. The plug connector means as set forth in claim 12, wherein the plug element is formed by an electrical terminal contact of an electromagnet associated with a valve or of some other component.

* * * * *